United States Patent
Chen et al.

(10) Patent No.: US 8,283,757 B2
(45) Date of Patent: Oct. 9, 2012

(54) QUAD FLAT PACKAGE WITH EXPOSED COMMON ELECTRODE BARS

(75) Inventors: Nan-Cheng Chen, Hsin-Chu (TW); Nan-Jang Chen, Hsinchu (TW); Ching-Chih Li, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 140 days.

(21) Appl. No.: 12/766,080

(22) Filed: Apr. 23, 2010

(65) Prior Publication Data

US 2010/0207260 A1 Aug. 19, 2010

Related U.S. Application Data

(63) Continuation-in-part of application No. 12/128,648, filed on May 29, 2008, now abandoned.

(60) Provisional application No. 60/950,363, filed on Jul. 18, 2007.

(51) Int. Cl.
*H01L 23/495* (2006.01)
(52) U.S. Cl. .............. 257/670; 257/E23.031; 438/123
(58) Field of Classification Search .............. 257/670, 257/E23.031; 438/123
See application file for complete search history.

(56) References Cited

U.S. PATENT DOCUMENTS

| | | | | |
|---|---|---|---|---|
| 5,723,899 A * | 3/1998 | Shin | | 257/666 |
| 5,780,925 A * | 7/1998 | Cipolla et al. | | 257/676 |
| 6,384,478 B1 | 5/2002 | Pour | | |
| 6,703,691 B2 * | 3/2004 | Chen et al. | | 257/666 |
| 6,818,973 B1 | 11/2004 | Foster | | |
| 6,995,459 B2 * | 2/2006 | Lee et al. | | 257/676 |
| 7,211,471 B1 | 5/2007 | Foster | | |
| 7,230,323 B2 * | 6/2007 | Lee et al. | | 257/670 |
| 7,489,021 B2 | 2/2009 | Juskey et al. | | |
| 7,521,294 B2 * | 4/2009 | Lee | | 438/123 |
| 7,936,055 B2 * | 5/2011 | Dimaano et al. | | 257/676 |
| 2002/0140061 A1 * | 10/2002 | Lee | | 257/666 |
| 2002/0195705 A1 | 12/2002 | Terui | | |
| 2006/0186528 A1 * | 8/2006 | Sasaki et al. | | 257/690 |
| 2007/0004092 A1 * | 1/2007 | Suzuki et al. | | 438/123 |
| 2007/0090502 A1 * | 4/2007 | Zhao et al. | | 257/675 |
| 2008/0111220 A1 * | 5/2008 | Lee et al. | | 257/676 |
| 2008/0191324 A1 * | 8/2008 | Qiao et al. | | 257/666 |
| 2009/0020860 A1 * | 1/2009 | Takahashi | | 257/670 |
| 2010/0200980 A1 * | 8/2010 | Tsumori | | 257/691 |

* cited by examiner

*Primary Examiner* — Allan R Wilson
(74) *Attorney, Agent, or Firm* — Thomas|Kayden

(57) ABSTRACT

An electronic package is provided. The electronic package comprises a die pad having a die attached thereon. A plurality of leads surrounds the die pad and spaced therefrom to define a ring gap therebetween. At least one first common electrode bar is in the ring gap and substantially coplanar to the die pad, in which at least one of the plurality of leads extends to the first common electrode bar. A molding compound partially encapsulates the die pad and the first common electrode bar, such that the bottom surfaces of the die pad and the first common electrode bar are exposed. A length of the first common electrode bar is substantially equal to a predetermined distance between two pads among a plurality of power or ground pads on a side of the die facing the first common electrode bar. An electronic device with the electronic package is also disclosed.

21 Claims, 3 Drawing Sheets

QUAD FLAT PACKAGE WITH EXPOSED COMMON ELECTRODE BARS

CROSS REFERENCE TO RELATED APPLICATIONS

This application is a Continuation-In-Part of pending U.S. patent application Ser. No. 12/128,648, filed May 29, 2008 and entitled "QUAD FLAT PACKAGE WITH EXPOSED COMMON ELECTRODE BARS", which claims the benefit of U.S. Provisional Application No. 60/950,363, filed Jul. 18, 2007, which has been abandoned, the entirety of which is incorporated by reference herein.

BACKGROUND OF THE INVENTION

1. Field of the Invention

The invention relates to electronics packaging technology and in particular to an exposed-pad quad flat package (QFP) having exposed common electrode bars and an electronic device including the package.

2. Description of the Related Art

Driven by miniaturization of highly integrated and advanced semiconductor devices, requirement for higher density packaging has increased. For this purpose, semiconductor manufacturers must provide semiconductor packages having thinner profiles. In the highly integrated and advanced semiconductor devices, to process signals at a high speeds, the heat developed in the dies and the inductance in package cannot be ignored. Thus, heat dissipation and lowering inductance are two important tasks for semiconductor manufacturers. The heat produced from die can be eliminated from the package by providing a thermal path. Additionally, the inductance can be lowered from the package by increasing the number of power or ground terminals.

In order to meet the above demand, exposed-pad quad flat package (QFP) has been developed for practical use. In the exposed-pad QFP, closely spaced leads along the edges of a die pad having a semiconductor die attached thereon are used for electrical connection between the die and the external circuits. Moreover, the bottom surface of the die pad is exposed from the package body and can be boned to a print circuit board (PCB) so that the heat from the die can be effectively dissipated.

However, high speed operation and high performance semiconductor devices require more signal processing terminals (leads), thus leading to fabrication difficulties with QFP. To solve this problem, ball grid array (BGA) packaging has been developed. In the BGA package, electrical contact balls for connecting the die to the external circuit are formed on the bottom surface of the package. Accordingly, compared to QFP, more electrical contact points with greater spacing therebetween can be accomplished. Unfortunately, BGA packaging is not cost-effective compared to QFP and the fabrication of a BGA package is more complicated than a QFP.

BRIEF SUMMARY OF INVENTION

A detailed description is given in the following embodiments with reference to the accompanying drawings. Electronic packages and electronic device are provided. An embodiment of an electronic package comprises a die pad having a die attached thereon. A plurality of leads surrounds the die pad and spaced therefrom to define a ring gap therebetween, wherein the plurality of leads are not coplanar to the die pad. At least one first common electrode bar is in the ring gap and substantially coplanar to the die pad, in which at least one of the plurality of leads extends to the first common electrode bar. A molding compound partially encapsulates the die pad and the first common electrode bar, such that the bottom surfaces of the die pad and the first common electrode bar are exposed. A length of the first common electrode bar is substantially equal to a predetermined distance between two pads among a plurality of power or ground pads on a side of the die facing the first common electrode bar.

Another embodiment of an electronic package comprises a die pad having a die attached thereon. A plurality of leads surrounds the die pad and spaced therefrom to define a ring gap therebetween, wherein the plurality of leads are not coplanar to the die pad. At least one first common electrode bar is in the ring gap and substantially coplanar to the die pad, in which at least two of the plurality of leads extends to the first common electrode bar. A molding compound partially encapsulates the die pad and the first common electrode bar, such that the bottom surfaces of the die pad and the first common electrode bar are exposed. A length of the first common electrode bar is substantially equal to a predetermined distance between two pads among a plurality of power or ground pads on a side of the die facing the first common electrode bar.

An embodiment of an electronic device comprises an electronic package and a circuit board bonded to the electronic package, in which the electronic package comprises a die pad having a die attached thereon. A plurality of leads surrounds the die pad and spaced therefrom to define a ring gap therebetween, wherein the plurality of leads are not coplanar to the die pad. At least one first common electrode bar is in the ring gap and substantially coplanar to the die pad, in which at least two of the plurality of leads extends to the first common electrode bar. A molding compound partially encapsulates the die pad and the first common electrode bar, such that the bottom surfaces of the die pad and the first common electrode bar are exposed. A length of the common electrode bar is substantially equal to a predetermined distance between two pads among a plurality of power or ground pads on a side of the die facing the common electrode bar.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. Embodiments of the invention are described with reference to the accompanying drawings.

Figure 1:
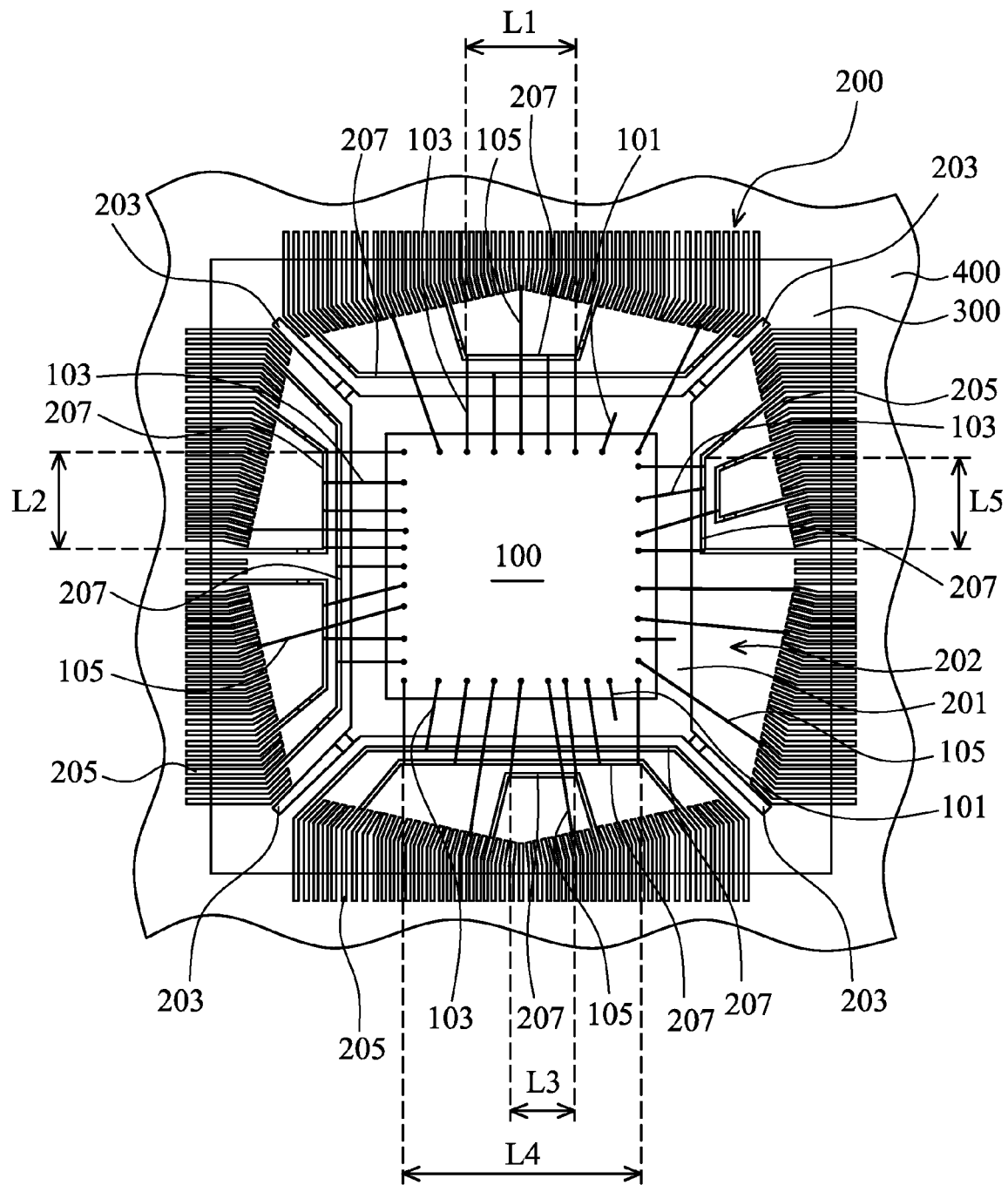
FIG. 1 is a plan view of an embodiment of an electronic device with a package body according to the invention.
Figure 2:
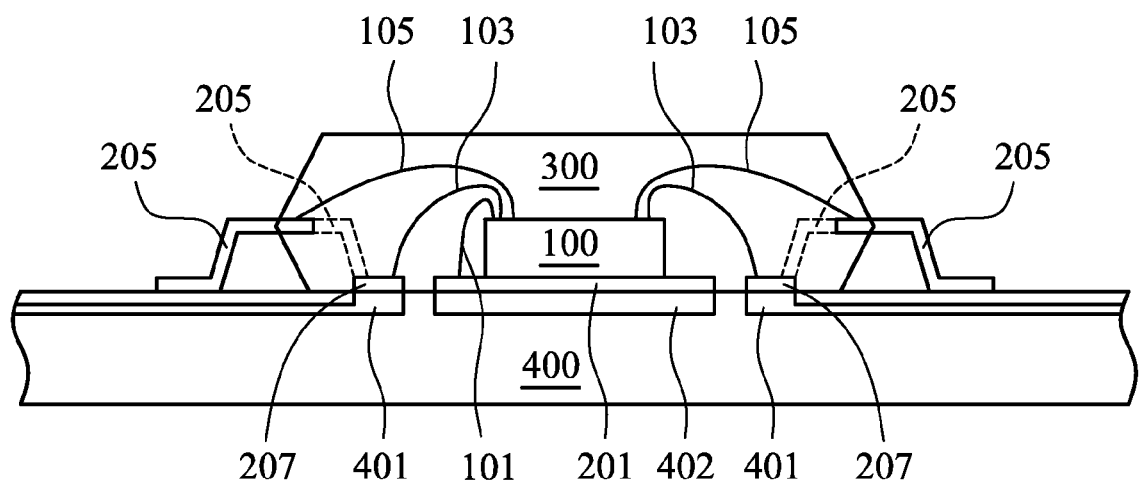
FIG. 2 is a cross section of the electronic device shown in FIG. 1.

Referring to FIGS. 1 and 2, in which FIG. 1 illustrates a plan view of an embodiment of an electronic device with a package body according to the invention and FIG. 2 illustrates a cross section of the electronic device shown in FIG. 1. The electronic device comprises an electronic package boned on a circuit board 400, such as a package substrate or a print circuit board (PCB). In this embodiment, the electronic package is an exposed-pad quad flat package (QFP).

In the embodiment, the electronic package comprises a die 100 including integrated circuits, a leadframe 200, and a molding compound 300, such as epoxy. The die 100 is typically square and has a top surface, such as an active surface, having a plurality of electrode pads (not shown) and an opposing bottom surface for attachment to the leadframe 200.

The leadframe 200 typically comprises metal, such as copper, aluminum, or metal alloy. Moreover, the leadframe 200 typically comprises a square die pad (or paddle) 201 attached to the bottom surface of the die 100 and a plurality of leads 205 surrounding the die pad 201 and spaced therefrom to define a ring gap 202 therebetween. The die pad 201 is structurally supported within the ring gap 202 by four tie bars 203 which are extended between the plurality of leads 205 and the die pad 201. Moreover, the tie bars 203 respectively corresponds to the corners of the die pad 201, such that the die pad 201 is mechanically connected to the leadframe 200. Generally, the tie bars 203 are subjected to a bending process to downset the die pad 201, such that the plurality of leads 205 is not coplanar to the die pad 201, as shown in FIG. 2. Additionally, the plurality of leads 205 are used as signal terminals and are electrically connected to the die 100 by wire bonding. A plurality of conductive wires extends between the corresponding pads on the top surface of the die 100 and the leads 205. In order to simplify the diagram, only a few conductive wires 105 and the corresponding pads (as indicted by dots connected to the conductive wires 105) are depicted in FIG. 1.

The leadframe further comprises one or more common electrode bar(s) 207 disposed in the ring gap 202, in which one or more lead(s) 205 extend to the common electrode bar 207 for structural support. For example, two leads 205 extending to the common electrode bar 207 are connected to both ends of the common electrode bar 207, respectively. Moreover, one or more lead(s) 205 extending to the common electrode bar 207 can be subjected to the bending process for downsetting the tie bars 203, such that the common electrode bar 207 is substantially coplanar to the die pad 201. The common electrode bar 207 can serve as one of power or ground pads, thereby being directly and electrically connected to the circuit board 400. One or more conductive wire(s) 103 may extend between the common electrode bar 207 and the power or ground pad(s) (as indicted by dots connected to the common electrode bar 207) of the die 100. In another embodiment, the common electrode bar 207 may serve as a common power pad and the die pad 201 serve as a ground pad. Accordingly, at least one additional conductive wire 101 extends between the ground pad of the die 100 and the die pad 201. Alternatively, the lead(s) 205 extending to the common electrode bar 207 may serve as a power or ground terminal(s).

In the embodiment, the leadframe 200 may comprise more than one common electrode bars 207 disposed within the ring gap 202 separated by the tie bars 203. One or more lead(s) 205 may extend to the corresponding common electrode bar 207. For example, there are two common electrode bars 207 disposed in the ring gap 202, in which one is between the other and the plurality of leads 205, and two leads 205 may extend to both ends of the corresponding common electrode bar 207, respectively, as shown in the upper and right sides of the leadframe 200 of FIG. 1. Moreover, there are three common electrode bars 207 disposed in the ring gap 202, in which two of the common electrode bars 207 are disposed between the other and the plurality of leads 205, and two leads 205 may extend to both ends of the corresponding common electrode bar 207, respectively, as shown in the left side of the leadframe 200 of FIG. 1. Alternatively, the common electrode bars 207 disposed in the ring gap 202 in sequence from the edge of the die pad 201 toward the plurality of leads 205, and two leads 205 may extend to both ends of the corresponding common electrode bar 207, respectively, as shown in the lower side of the leadframe 200 of FIG. 1. In one embodiment, at least one common electrode bar 207 has a length substantially equal to a predetermined distance between two pads, among the plurality of power or ground pads, connected to the corresponding common electrode bar 207 and on a side of the die 100 facing the corresponding common electrode bar 207. There may be more than one power supply voltages provided to the die 100. The power or ground pads receiving one voltage may not be positioned as a group but be mixed up with power or ground pads receiving another voltage instead according to design of the die 100. A common electrode bar 207 has a length substantially matching or equal to the predetermined distance of two power or ground pads receiving the same voltage can facilitate the bonding of wire 103 between the common electrode bar 207 and the corresponding power or ground pads on the side of the die 100 facing the common electrode bar 207. More than one common electrode bar 207 can be provided since there may be more than one power supply voltages provided to the die 100. For example, there can be at least one common electrode bar 207 has a length L1, L2, L3, L4 or L5 substantially equal to a predetermined distance between two pads, among the plurality of power or ground pads, connected to the corresponding common electrode bar 207 and on a side of the die 100 facing the corresponding common electrode bar 207. Though "substantially equal" is employed here, the length of the common electrode bar 207 can be longer or shorter according to design requirement without hinder the bonding of wire 103 between the common electrode bar 207 and the corresponding power or ground pads.

Figure 3:
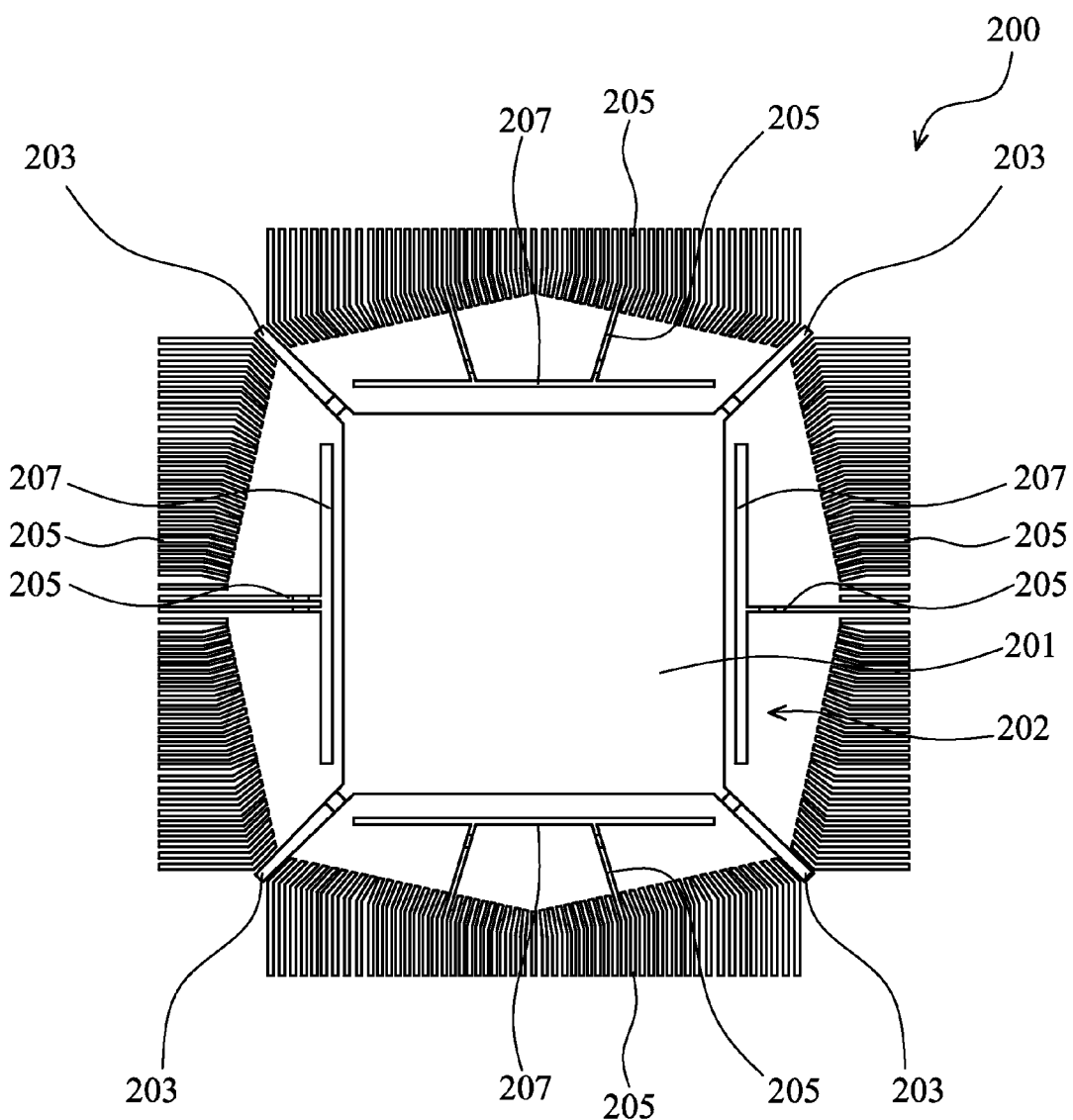
FIG. 3 is a plan view of an exemplary embodiment of a leadframe used in the electronic device shown in FIG. 1.

Referring to FIG. 3, which illustrates a plan view of an exemplary embodiment of a leadframe used in the electronic device shown in FIG. 1. Elements in FIG. 3 that are the same as in FIG. 1 are labeled the same not described again for brevity. In this embodiment, the leadframe 200 comprises a plurality of common electrode bars 207 substantially arranged in a ring surrounding the die pad 201. Moreover, the number of the leads 205 for structurally supporting the corresponding common electrode bar 207 can be varied. For example, the common electrode bars 207 may be supported by two adjacent extended leads 205, as shown in the left side of the leadframe 200 of FIG. 3. Moreover, the common electrode bars 207 may be supported by two extended leads 205 not adjacent to each other, as shown in the upper side of the leadframe 200 of FIG. 3. Additionally, the common electrode bars 207 may be supported by a single extended lead 205 or more than two extended leads 205, as shown in the right and lower sides of the leadframe 200 of FIG. 3. Note that those of ordinary skill in the art would recognize that the numbers of the common electrode bar 207 and the extended leads 205, and the arrangements of the common electrode bars 207 and the extended leads 205 are based on design demands and are not limited by the embodiments of FIGS. 1 and 3.

The leadframe 200 can be fabricated by a conventional etching or stamping process. After fabrication of leadframe 200, die mounting and wire bonding processes are successively performed, thus completing the electrical connection between the die 100 and the leadframe 200. A subsequent mold compound 300, such as epoxy, covers the die 100 and partially encapsulates the leadframe 200 by a molding process, such that the outer end of each lead 205 and the bottom surfaces of the die pad 201 and the common electrode bar(s) 207 are exposed to the outside of the package body.

The electronic package can be completed after sequentially performing conventional dejunk/trimming and forming/singular. The electronic package is further boned to the circuit board 400, as shown in FIG. 2. In particular, the circuit board 400 may comprise one or more power/ground bond pad(s) 401 and an additional ground bond pad 402 aligned and attached to the common electrode bar(s) 207 and the die pad 201, respectively.

According to the embodiments of the invention, by using the common electrode bars to serve as power and/or ground pads, the leads for connecting to power and ground terminals can be reduced. In other words, the leads for signal processing can be relatively increased which aids with high speed operation and high device performance. Moreover, the length of the conductive wires connecting between the common electrode bars and the die is relatively shorter than that connecting between the die and the leads serving as power or ground terminals, thus the path inductance and resistance can be reduced. Better performance of power integrity (PI) can be achieved as it is inversely proportional to path inductance. IR drop problem of core power can also be improved due to reduction of path resistance. Additionally, since the common electrode bars serving as power and/or ground pads has a larger area than that of the lead, power stability can be increased and path inductance and resistance can be further reduced as the common electrode bars are directly boned to the power pads of the circuit board.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic package, comprising:
a die pad;
a die attached to the die pad;
a plurality of leads surrounding the die pad and spaced therefrom to define a ring gap therebetween, wherein the plurality of leads are not coplanar to the die pad;
at least one first common electrode bar in the ring gap and substantially coplanar to the die pad, wherein at least one of the plurality of leads extends to the first common electrode bar; and
a molding compound partially encapsulating the die pad and the first common electrode bar, such that the bottom surfaces of the die pad and the first common electrode bar are exposed.

2. The electronic package of claim 1, further comprising a second common electrode bar in the ring gap between the first common electrode bar and the plurality of leads and substantially coplanar to the die pad, wherein at least one of the plurality of leads extends to the second common electrode bar.

3. The electronic package of claim 2, further comprising a third common electrode bar in the ring gap between the first common electrode bar and the plurality of leads and substantially coplanar to the die pad, wherein at least one of the plurality of leads extends to the third common electrode bar.

4. The electronic package of claim 3, wherein the lead extending to the first, second or third common electrode bar serves as one of power or ground terminals.

5. The electronic package of claim 3, wherein the first, second or third common electrode bar serves as one of power or ground pads.

6. The electronic package of claim 3, wherein the second common electrode bar is between the first and third common electrode bars.

7. The electronic package of claim 3, further comprising at least one conductive wire extending between the die and the first common electrode bar, at least one conductive wire extending between the die and the second common electrode bar, and at least one conductive wire extending between the die and the third common electrode bar.

8. The electronic package of claim 1, wherein the electronic package comprises a plurality of first common electrode bars substantially arranged in a ring surrounding the die pad.

9. An electronic package, comprising:
a die pad;
a die attached to the die pad;
a plurality of leads surrounding the die pad and spaced therefrom to define a ring gap therebetween, wherein the plurality of leads are not coplanar to the die pad;
at least one first common electrode bar in the ring gap and substantially coplanar to the die pad, wherein at least two of the plurality of leads extend to the first common electrode bar; and
a molding compound partially encapsulating the die pad and the first common electrode bar, such that the bottom surfaces of the die pad and the first common electrode bar are exposed.

10. The electronic package of claim 9, further comprising a second common electrode bar in the ring gap between the first common electrode bar and the plurality of leads and substantially coplanar to the die pad, wherein at least two of the plurality of leads extends to the second common electrode bar.

11. The electronic package of claim 10, further comprising a third common electrode bar in the ring gap between the first common electrode bar and the plurality of leads and substantially coplanar to the die pad, wherein at least two of the plurality of leads extends to the third common electrode bar.

12. The electronic package of claim 11, wherein the leads extending to the first, second or third common electrode bar serve as two of power or ground terminals.

13. The electronic package of claim 11, wherein the first, second or third common electrode bar serves as one of power or ground pads.

14. The electronic package of claim 11, wherein the second common electrode bar is between the first and third common electrode bars.

15. The electronic package of claim 11, further comprising at least one conductive wire extending between the die and the first common electrode bar, at least one conductive wire extending between the die and the second common electrode bar, and at least one conductive wire extending between the die and the third common electrode bar.

16. The electronic package of claim 11, wherein the leads extending to the first, second, and third common electrode bars, respectively, are connected to the ends of the first, second, and third common electrode bars, respectively.

17. The electronic package of claim 9, wherein the electronic package comprises a plurality of first common electrode bars substantially arranged in a ring surrounding the die pad.

18. An electronic device, comprising:
an electronic package, comprising:
- a die pad;
- a die attached to the die pad;
- a plurality of leads surrounding the die pad and spaced therefrom to define a ring gap therebetween, wherein the plurality of leads are not coplanar to the die pad;
- at least one common electrode bar in the ring gap and substantially coplanar to the die pad, wherein at least two of the plurality of leads extend to the common electrode bar; and
- a molding compound partially encapsulating the die pad and the common electrode bar, such that an outer end of each lead and the bottom surfaces of the die pad and the common electrode bar are exposed; and
- a circuit board bonded to the electronic package.

19. The electronic device of claim 18, wherein the circuit board comprises at least one power or ground bond pad attached to the common electrode bar.

20. The electronic device of claim 18, further comprising at least two conductive wires extending between the die and the common electrode bar.

21. The electronic device of claim 18, wherein the electronic package comprises a plurality of common electrode bars substantially arranged in a ring surrounding the die pad.

* * * * *